United States Patent [19]

Matsutani

[11] Patent Number: 4,830,703

[45] Date of Patent: May 16, 1989

[54] SINGLE CRYSTAL GROWTH APPARATUS

[75] Inventor: Kinya Matsutani, Yokohama, Japan

[73] Assignee: Kabushiki Kaisha Toshiba, Kawasaki, Japan

[21] Appl. No.: 51,194

[22] Filed: May 18, 1987

Related U.S. Application Data

[63] Continuation of Ser. No. 761,699, Aug. 2, 1985, abandoned.

[30] Foreign Application Priority Data

Aug. 10, 1984 [JP] Japan .................. 59-167514

[51] Int. Cl.⁴ ............................ C30B 15/22
[52] U.S. Cl. ................. 156/617.1; 156/601; 156/619.1; 156/DIG. 80; 422/249
[58] Field of Search ......... 156/DIG. 80, 601, 617 SP, 156/619, 617 H; 422/249

[56] References Cited

U.S. PATENT DOCUMENTS

| | | | |
|---|---|---|---|
| 3,074,785 | 1/1963 | Gremmelmaier | 156/619 |
| 3,607,139 | 9/1971 | Hanks | 422/249 |
| 3,798,007 | 3/1974 | Bochman et al. | 156/619 |
| 4,565,671 | 1/1986 | Matsutani et al. | 422/249 |
| 4,592,895 | 6/1986 | Matsutani et al. | 422/249 |
| 4,659,423 | 4/1987 | Kim et al. | 422/249 |

FOREIGN PATENT DOCUMENTS

| | | | |
|---|---|---|---|
| 60-33294 | 2/1985 | Japan | 422/249 |
| 60-36392 | 2/1985 | Japan | 156/617.1 |
| 60-27682 | 2/1985 | Japan | 156/617.1 |
| 60-51692 | 3/1985 | Japan | 422/249 |
| 60-51690 | 3/1985 | Japan | 156/617.1 |
| 993880 | 6/1965 | United Kingdom | 156/617.1 |

OTHER PUBLICATIONS

IBM Technical Disclosure Bulletin, vol. 26, No. 2, (Jul. 1983), pp. 601 to 603.
Japanese Patent Disclosure (Kokai) No. 58-217493; disclosed 12/17/83; request for examination; not yet made; Applicants: Nippon Telegraph and Telephone Public Corporation et al; "Lift-up Method for a Single Crystal".
Japanese Patent Disclosure (Kokai) No. 57-149894; disclosed: 9/16/82; request for examination: not yet made; Applicant: Nippon Telegraph and Telephone Public Corporation; "Crystal Growth Method and Apparatus".
Japanese Patent Disclosure (Kokai) No. 56-104791; disclosed 8/20/81; request for examination: made; Applicant: Sony Corporation; "Crystal Growth Method".

Primary Examiner—John Doll
Assistant Examiner—Robert M. Kunemund
Attorney, Agent, or Firm—Oblon, Fisher, Spivak, McClelland & Maier

[57] ABSTRACT

A pair of coils are arranged to surround a crucible for storing a melt. The axes of the coils are vertical and the melt is heated by a heater. When the coils are energized such that the magnetic fluxes thereof oppose each other along the axial direction, a magnetic field having an isomagnetic field distribution of an elliptical shape is formed. When the energization current is properly selected, a magnetic field for restricting thermal convection of the upper melt portion is formed, while, conversely, thermal convection of the lower melt portion occurs. When the melt surface level is lowered upon pulling of the single crystal, a magnetic field is controlled such that the boundary between the thermal convection restriction region and the thermal convection region is, similarly, lowered. Since thermal convection is restricted near the solid-liquid interface layer, the single crystal can be stably grown. In the lower melt portion, thermal convection is present such that the lower melt is stirred. The temperature of the melt is uniform, thereby manufacturing a uniform single crystal ingot of high quality.

15 Claims, 7 Drawing Sheets

FIG. 1 (PRIOR ART)
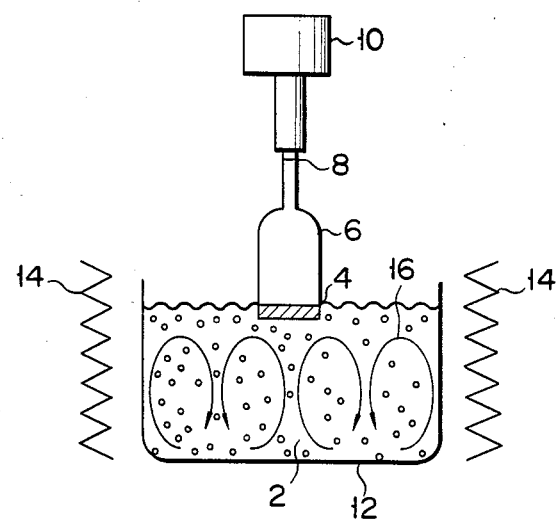
FIG. 2A (PRIOR ART)
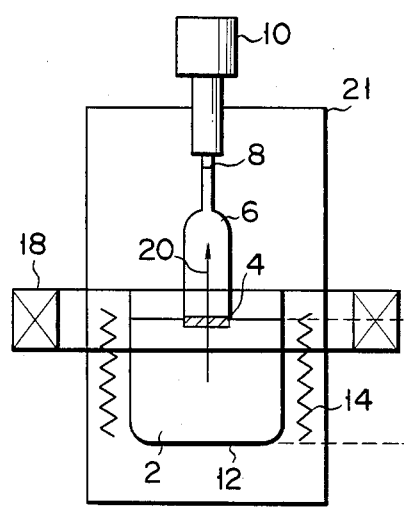
FIG. 2B  FIG. 2C (PRIOR ART) (PRIOR ART)
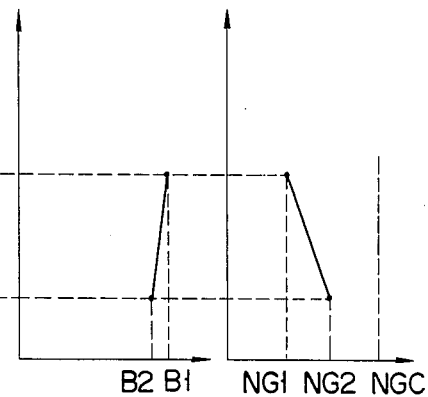

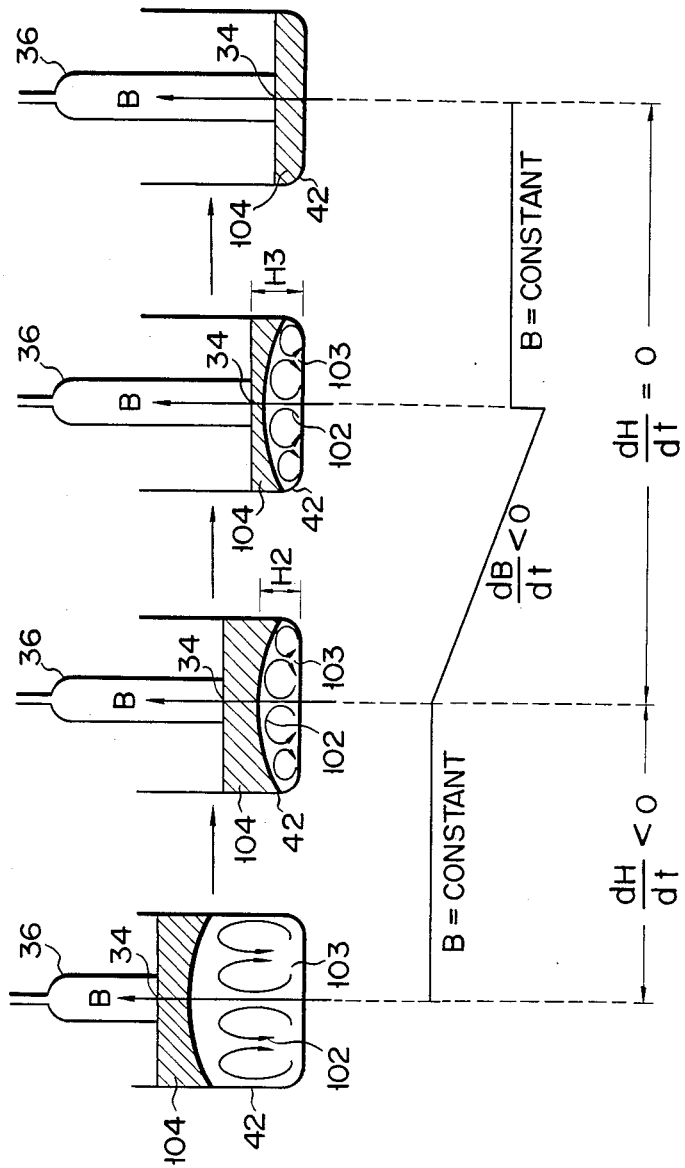

SINGLE CRYSTAL GROWTH APPARATUS

This application is a continuation of application Ser. No. 761,699 filed on Aug. 2, 1985, now abandoned.

BACKGROUND OF THE INVENTION

The present invention relates to a single crystal growth apparatus for pulling up a single crystal while a magnetic field is applied to a single crystal material melt.

When a single crystal is grown in accordance with Czochralski growth, a single crystal material melt 2 stored in a crucible 12 is heated by a heater 14 so as not to permit the melt to soldify, as shown in FIG. 1. In this state, a seed crystal 8 is dipped in the melt 2. When the seed crystal is pulled by a seed shaft lift and rotation mechanism 10 at a predetermined speed, a crystal is grown in a solid-liquid interface layer 4, thereby preparing a single crystal 6.

The melt 2 is convected in the direction indicated by each arrow 16 upon energization of the heater 14. This thermal convection occurs when a buoyancy, by thermal expansion of a fluid, is unbalanced with a viscosity thereof. A dimensionless number representing the balance between the buoyancy and viscosity is Grashof number $$N_{GR} = g \cdot \alpha \cdot \Delta T \, R^3 / \nu^3 \tag{1}$$

where
- g: gravitational acceleration,
- α: the thermal expansion coefficient of the material melt,
- ΔT: the temperature difference along the radial direction of the crucible,
- R: the radius of the crucible, and
- ν: the dynamic viscosity coefficient of the material melt.

When the Grashof number $N_{GR}$ exceeds a critical number determined by the geometric dimensions and the thermal boundary condition of the melt, thermal convection occurs in the melt. In general, when $N_{GR}$ exceeds $10^5$, the thermal convection of the melt results in a turbulent flow. Furthermore, when $N_{GR}$ exceeds $10^9$, the thermal convection results in turmoil. In normal operation, a single crystal ingot having a diameter of 3 to 4 inches is prepared by pulling up a seed crystal. However, in this case, the melt is in a state of turmoil. For this reason, the material melt surface and the solid-liquid interface layer 4 is waved.

When thermal convection causes a turmoil state, a temperature change at the solid-liquid interface in the material melt is increased. The thickness of the layer 4 changes locally or over time, and, for this reason, the crystal is remelted microscopically during crystal growth, with dislocation loops and bulk stacking defects being formed in the crystal. These defects occur non-uniformly along the single crystal pulling direction since the solid-liquid interface changes irregularly. The melt 2, at a temperature of, for example, 1,500° C., is in contact with the inner surface of the crucible 12 so that a getter impurity is dissolved from the crucible 12 into the melt 2. The mobile impurity is dispersed by thermal convection (indicated by arrow 16) throughout the melt 2. Since the impurity is gettered or captured in the bulk stacking defects to cause dislocation loops, various types of defects and growth fringes are formed in the single crystal ingot or boule, thereby degrading the quality of the single crystal.

When the single crystal ingot is sliced to prepare large scale integrated circuit (LSI) wafers, a wafer including the defects cannot be used and is, subsequently, disposed of since its electrical characteristics are degraded. For this reason, the yield of wafers is low. Although demand has arisen for an increase in the diameter of a singel crystal ingot, when the crucible radius is increased the Grashof number $N_{GR}$ is also increased, as is apparent from equation (1), and, as a result, thermal convection of the melt 2 becomes more significant such that the quality of the resultant single crystal ingot is degraded.

In a single crystal growth apparatus, as shown in FIG. 2A, a DC magnetic field is applied by a coil 18 to the melt 2 so as to pull up the single crystal under growth conditions of thermal and chemical equilibrium by suppressing thermal convection. A uniform magnetic field is applied by the coil 18 to the melt 2 in a direction indicated by arrow 20, the melt being electrically conductive. When the melt 2 is moved by thermal convection in a direction which is not parallel to the direction of the magnetic field, the melt 2 receives a reluctance in accordance with Lenz's law. Thermal convection of the melt 2 is thus suppressed. In general, a magnetic viscosicity coefficient $\nu_E$ representing the reluctance upon application of a magnetic field is expressed by equation (2) below:

$$\nu_E = (\mu H D)^2 \sigma / \rho \tag{2}$$

where
- μ: the magnetic permeability of the melt,
- H: the magnetic field intensity,
- D: the crucible diameter,
- σ: the electrical conductivity of the melt, and
- ρ: the density of the melt.

As is apparent from equation (2), when the magnetic field intensity is increased, the magnetic viscosity coefficient $\nu_E$ is also increased, but, when the dynamic viscosity coefficient $\nu$ is increased, the Grashof number $N_{GR}$ is greatly decreased. When a magnetic field intensity exceeds a specific value, the Grashof number $N_{GR}$ decreases below the given critical value. When a magnetic field having an intensity exceeding the specific value is applied to the melt 2, thermal convection of the melt 2 is almost stopped. As a result, the impurity is not gettered in the stacking defects in the single crystal ingot. The dislocation loop, other defects and growth fringes will not, consequently, be formed. The quality of the single crystal ingot is uniform along the pull-up direction, thereby increasing the yield of the ingots.

However, in a single crystal growth apparatus for manufacturing single crystal ingots, each having a diameter of 4 inches or more, the crucible 12 has a diameter of 6 inches or more, making it very large. In addition, a chamber 21 for housing the crucible 12 and a heater 14 has an inner diameter of several hundreds of millimeters. As a result, the single crystal growth apparatus has, as a whole, a very large size.

In general, the diameter of the crucible 12 is larger than the depth thereof. When a maximum amount of melt 2 is charged in the crucible 12, the radius of the crucible is substantially the same as the depth thereof. When a magnetic field is applied to the melt in the crucible 12, a magnetic field intensity distribution is as shown in FIG. 2B. The temperature distribution of the melt 2 is uniform along the direction of the height of the crucible 12 due to the diameter/height ratio. A relationship between a magnetic field intensity B1 in the layer 4 and a magnetic field intensity B2 at the lower portion of the crucible 12 is given by the following inequality:

$$|(B1-B2)/B1| < 5\%$$

where symbol | | represent an absolute value. A Grashof number distribution of the melt 2, corresponding to the magnetic field distribution shown in FIG. 2B, is less then the critical value $N_{GC}$ for the melt 2 throughout the crucible 12, as shown in FIG. 2C. Referring to FIG. 2C, $N_{G1}$ and $N_{G2}$ correspond to the Grashof numbers of a melt portion near the layer 4, and a melt portion near the bottom of the crucible 12, respectively. For this reason, in the conventional crystal growth apparatus, thermal convection is stopped throughout the melt 2 in the crucible 12, and the melt 2 is completely motionless. In this state, heat conduction by convection will not occur. Heat is conducted from the heater 14 to the melt 2 at the center of the crucible 2.

When a single crystal ingot diameter is as small as 2 to 3 inches, an inner diameter of the crucible 12 can be as small as 4 to 5 inches. For this reason, even if the melt is completely still upon application of the magnetic field, heat from the heater 14 is sufficiently conducted to the layer 4. For this reason, a temperature difference between a melt portion near the layer 4 and a melt portion near the crucible 12 normally falls within a range between 10° and 20° C. However, when a single crystal ingot diameter is increased to 4 inches or more, the diameter of the crucible 12 needs to be 6 to 14 inches, greatly increasing the crucible size. Consequently, heat from the heater 14 cannot be sufficiently transferred to the layer 4 by thermal conduction in the melt 2 alone. For this reason, a large temperature gradient of several tens of degrees centigrade is generated between the melt portion of the layer 4 and the melt portion near the inner surface of the crucible 12. In order to effectively grow a single crystal 6 in the layer 4, a temperature of the layer 4 must be sufficiently higher than that of the melt. In order to manufacture a large-diameter single crystal ingot, the power of the heater 14 is increased to compensate for a decrease in temperature due to the temperature gradient, and to set the layer 4 at a predetermined temperature. When the single crystal ingot diameter is increased, and a temperature gradient in the melt is large, a temperature gradient occurs in the layer 4. The temperature gradient in the layer 4 prevents uniform single crystal growth. When a temperature difference between the center of the crucible and the melt portion near the inner surface of the crucible is excessively large, an excessive thermal stress acts on the crucible 12 such that the crucible 12 tends to crack.

When a large-diameter single crystal ingot is manufactured by a conventional single crystal growth apparatus, the temperature gradient at the center of the melt and that at the solid-liquid interface layer is increased excessively, resulting in inconvenience. Therefore, a uniform single crystal ingot cannot be obtained, high power is required to heat the melt, and the crucible tends to crack.

SUMMARY OF THE INVENTION

It is an object of the present invention to provide a single crystal growth apparatus wherein a temperature difference between a melt portion near a solid-liquid interface layer and a melt portion near an inner surface of a crucible is small, high power is not required to heat the melt, the crucible will not crack and a uniform single crystal ingot of high quality can be manufactured.

In order to achieve the above object of the present invention, there is provided a single crystal growth apparatus comprising a vessel for holding a single crystal material melt, heating means for heating the melt in the vessel, a single crystal puller for dipping a seed crystal in the melt and for pulling a single crystal growing in a solid-liquid interface layer in the melt, magnetic field forming means for forming both a first magnetic region having an intensity for preventing thermal convection in an upper melt portion and a second magnetic region having an intensity which does not prevent thermal convection in a lower melt portion, and magnetic field adjusting means for moving a boundary between the first and second magnetic regions downward upon the downward shift of a surface of the melt.

According to the present invention, the first magnetic region is formed to prevent thermal convection in the upper melt portion, and the second magnetic region is formed not to prevent thermal convection in the lower melt portion. Thermal convection is limited near the solid-liquid interface layer so that the single crystal is grown in a condition of thermal and chemical equilibrium. Since thermal convection is present in the second magnetic region below the first magnetic region, the melt is stirred sufficiently and uniformly. For this reason, the temperature distribution of the melt is uniform. Therefore, heat is sufficiently conducted to the solid-liquid interface layer. A temperature difference between the melt portion around the vessel (crucible) and the solidliquid interface layer is small. Therefore, the sufficiently stirred melt can be supplied to the solid-liquid interface layer, thereby obtaining a relatively uniform single crystal.

Since the temperature difference between the peripheral portion of the crucible and the center thereof is small, cracking of the crucible, which is caused by thermal stress, can be avoided.

When a magnetic field intensity is decreased by decreasing the coil distance, a superconductive coil is used to vary a magnetic field in a permanent current mode.

The coils may be arranged with their axes aligned with each other, and energized such that the magnetic flux directions along the axes thereof oppose each other. A magnetic field is generated between the coils, the isomagnetic field curves thereof having either an elliptical or a circular shape. This magnetic field includes components parallel and perpendicular to the pull-up direction of the single crystal. For this reason, thermal convection along all directions can be controlled by the magnetic field.

If the pair of coils for generating magnetic fields acting along opposing directions is used as a magnetic field forming means, a magnetic field directed from the area between the coils to the exterior of the region can be cancelled by the magnetic field generated by the coils. Therefore, a magnetic field component leaking from the area between the coils is small.

According to the present invention, since the temperature difference between the solid-liquid interface layer and the melt portion near the inner surface of the vessel (crucible) is small, a single crystal ingot of a high quality can be manufactured.

BRIEF DESCRIPTION OF THE DRAWINGS

FIG. 1 shows how a single crystal grows in the Czochralski method;

FIGS. 2A, 2B and 2C are, respectively, a sectional view and graphs for explaining a conventional single crystal growth apparatus;

FIGS. 7A, 7B, 7C and 7D are sectional views for explaining the operation of the apparatus shown in FIG. 3;

DETAILED DESCRIPTION OF THE PREFERRED EMBODIMENTS

Figure 3:
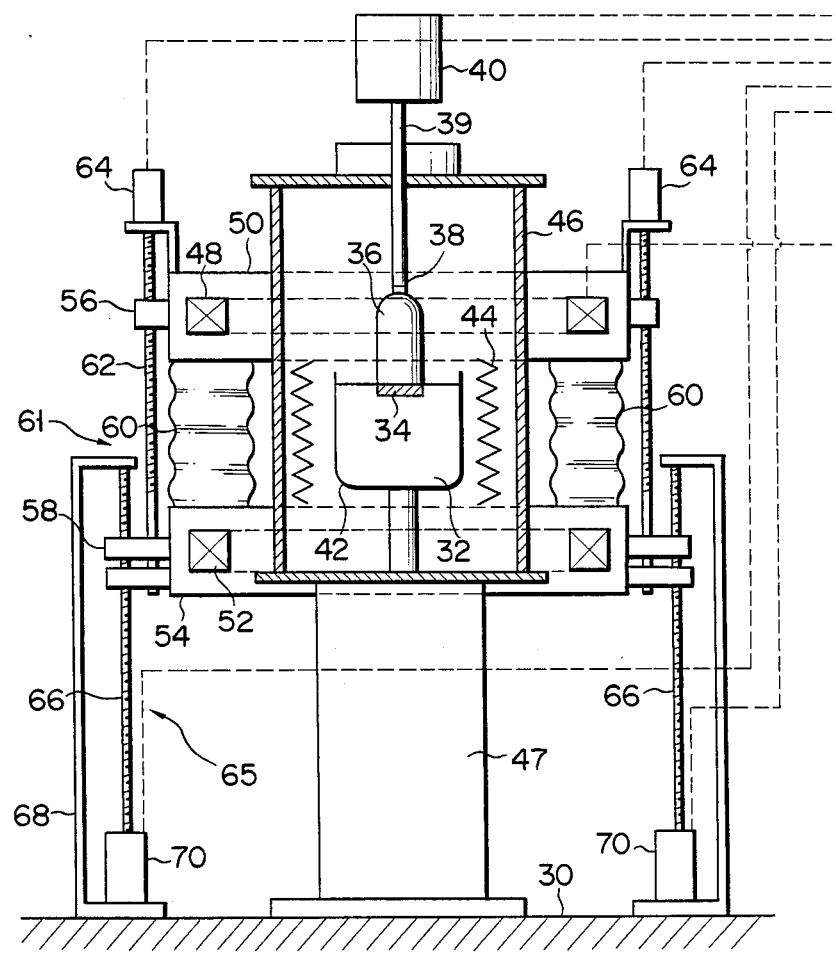
FIG. 3 is a sectional view showing a single crystal growth apparatus according to an embodiment of the present invention.
Figure 4:
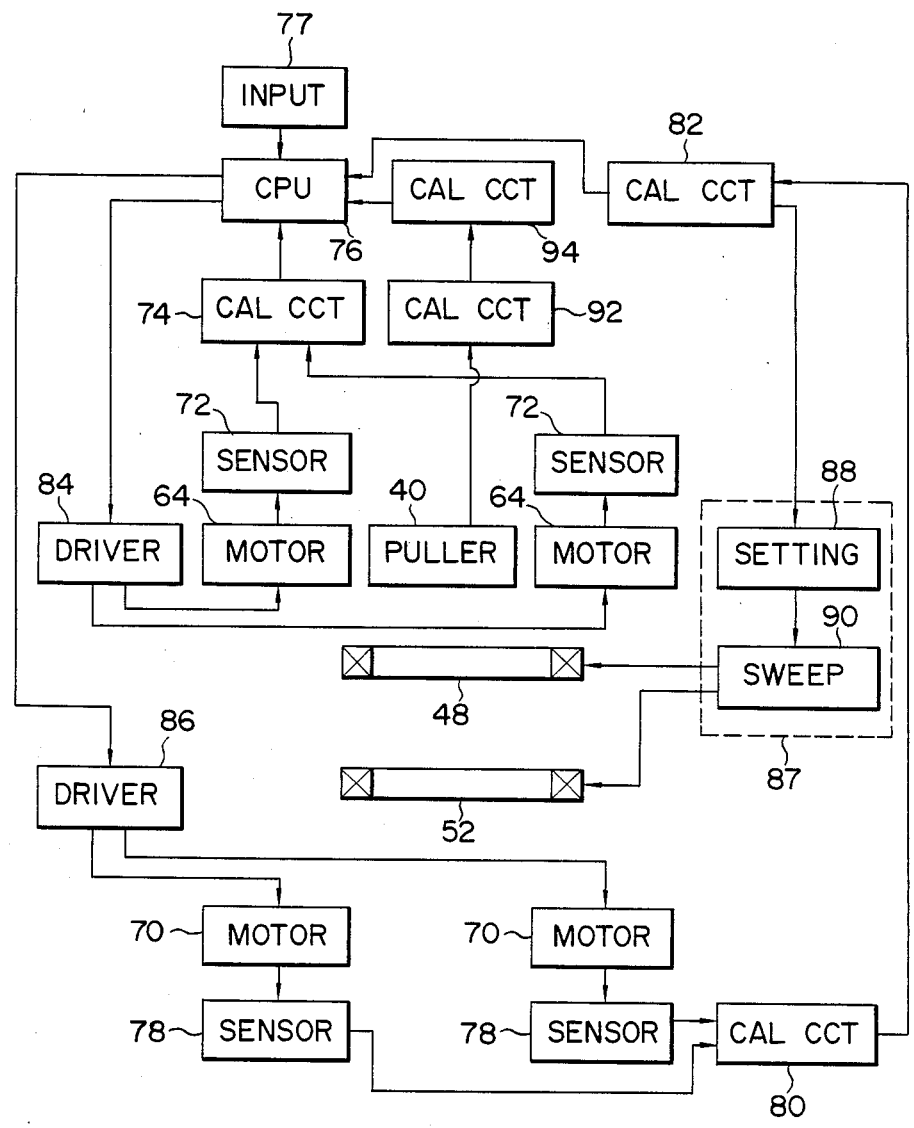
FIG. 4 is a block diagram of a control device of the apparatus shown in FIG. 3.

FIG. 3 shows a single crystal growth apparatus according to a first embodiment of the present invention, and FIG. 4 is a block diagram of a control device thereof. A chamber 46 is placed on a base 30 through a table 47 having a predetermined height. A crucible 42 is placed in the chamber 46. The crucible 42 is surrounded by a heater 44. A melt 32, in the crucible 42, is heated upon energization of the heater 44.

Drive shafts 66 are vertically and rotatably supported by corresponding supports 68 on the base 30 at a plurality of positions surrounding the chamber 46. Each shaft 66 comprises a screw rod which is threaded into a corresponding movable member 58. The shafts 66 themselves are coupled to corresponding motors 70. Upon rotation of the motors 70, the members 58 are moved vertically. Drive shafts 62 are vertically supported to be rotatable with respect to the members 58, respectively. Each shaft 62 comprises a screw rod which is threaded into a corresponding movable member 56. Motors 64 are coupled to the drive shafts 62, respectively. The movable members 56 are vertically moved upon rotation of the motors 64. The motors 64, the shafts 62 and the members 56 constitute a coil distance adjusting mechanism 61, while the motors 70, the shafts 66 and the members 58 constitute a coil position adjusting mechanism 65.

A ring-like housing 50 is mounted on all the members 56 engaged with the shafts 62 arranged around the chamber 46. A superconductive coil 48 is housed in the housing 50 such that its axis is aligned with the axis of the crucible 42. A ring-like housing 54 is also fixed to the members 58. A superconductive coil 52 is housed in the housing 54 such that its axis is aligned with that of the crucible 42. The housings 50 and 54 are coupled through a bellows-like connecting member 60. The coils 48 and 52 are connected through the member 60 which can be extended or contracted when a distance between the housings 50 and 54 is changed. The housings 50 and 54, and the member 60 are filled with liquid helium. The coils 48 and 52 are dipped in liquid helium at a liquid helium temperature of 4.2° K. Opposing currents flow in the coils 48 and 52 with respect to their axes.

The melt 32, as a single crystal material, is held in the crucible 42. A puller 40 is arranged above the chamber 46. A support rod 39 is mounted on the puller 40. The lower end of the support 39 is inserted into the chamber 46 so that the rod 39 is moved vertically by the puller 40. A seed crystal 38 is mounted at the lower end of the rod 39. After the seed crystal 38 is dipped by the puller 40 in the melt 32, the seed crystal 38 is pulled and the single crystal is grown in a solid-liquid interface layer 34, thereby producing a single crystal ingot 36.

The speed of the motor 64 is detected by a motor speed sensor 72 (see FIG. 4) whose detection signal is supplied to a coil distance calculation circuit 74. A coil distance is calculated by the circuit 74 and an output therefrom is supplied to a CPU 76. Similarly, the speed of the motor 70 is detected by a motor speed sensor 78, and a detection signal is supplied to a coil position calculation circuit 80. A coil position is calculated by the circuit 80, and an output therefrom is supplied to a magnetic field distribution calculation circuit 82.

The motors 64 and 70 are connected to drivers 84 and 86, respectively. The drivers 84 and 86 are connected to the CPU 76. The CPU 76 supplied control signals to the drivers 84 and 86 which then drive the motors 64 and 70, respectively. The circuit 82 supplies, to a magnetic current setting circuit 88, a signal which corresponds to a predetermined magnetic field to be applied to the melt 32 in the crucible 42. The circuit 88 calculates a coil energization current corresponding to the magnetic field signal on the basis of the signal supplied from the circuit 82, and an output from the circuit 88 is supplied to an energization current sweep circuit 90. The circuit 90 changes energization currents applied to the coils 48 and 52 within predetermined values, and an output from the circuit 90 is supplied to the coils 48 and 52.

An operation signal from the puller 40 is supplied to a pulling speed calculation circuit 92. A pulling speed of the single crystal is calculated by the circuit 92, and an output from the circuit 92 is supplied to a melt surface position calculation circuit 94. A melt surface position is calculated in accordance with the pulling speed of the single crystal. The melt surface position signal is supplied from the circuit 94 to the CPU 76.

Figure 5:
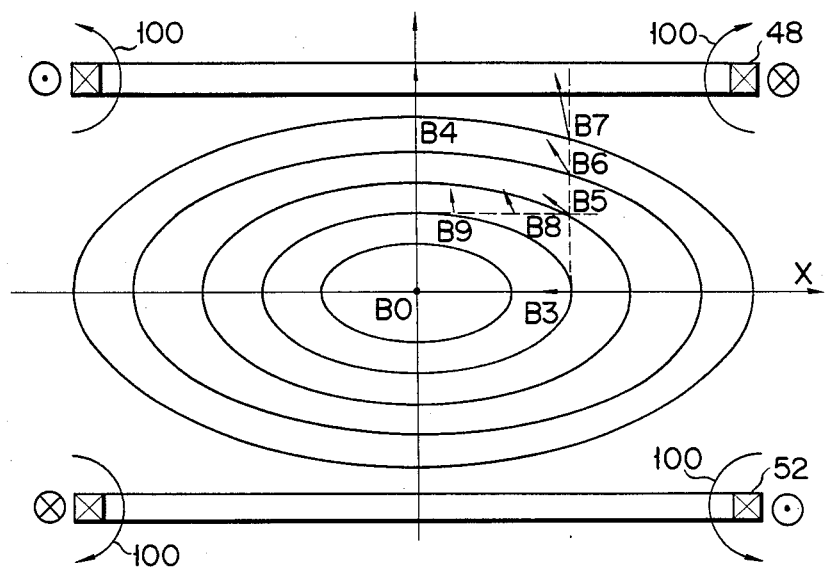
FIG. 5 is a graph showing the isomagnetic field distribution of the magnetic field generated by coils.

With the above arrangement, when the coils 48 and 52 are energized, a magnetic field, having an isomagnetic field distribution in a plane including the axes of the coils, as shown in FIG. 5, is formed in the melt 32 between the coils 48 and 52. When currents flow through the coils 48 and 52 in accordance with energization directions shown in FIG. 5, magnetic fields are generated by the coils 48 and 52 in the directions indicated by arrows 100. Magnetic flux directions $B_0$ to $B_7$ are illustrated between the coils 48 and 52. The positions subject to equal magnetic field intensity are plotted as ellipses, as shown in FIG. 5. When the axial direction of the coils 48 and 52 is defined as Z-axis, and a direction passing through the center of the coils 48 and 52 and perpendicular to the Z-axis is defined as X-axis, a magnetic field intensity $B_0$, at an intersection (i.e., the origin) between the X- and Z-axes, is zero.

Figure 6:
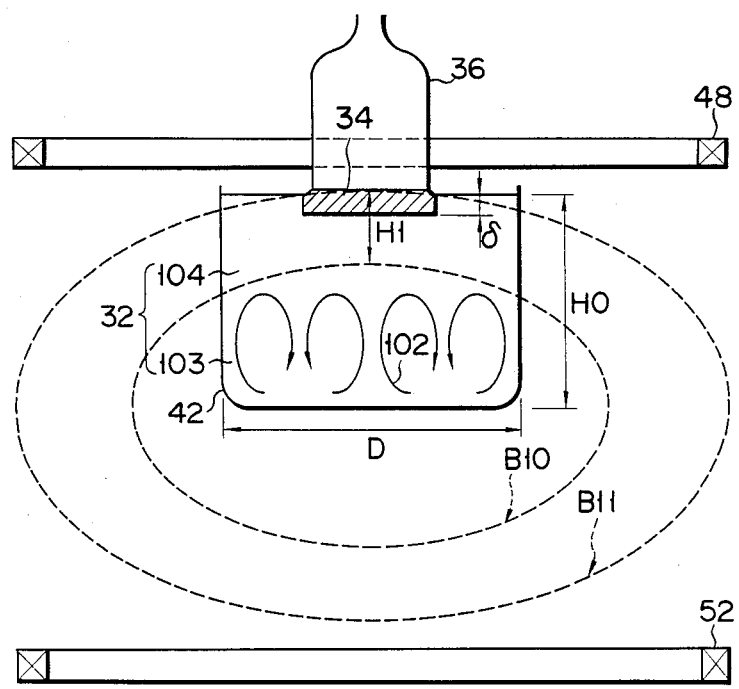
FIG. 6 is a graph showing a relationship between a thermal convection restriction region in which thermal convection is restricted by the magnetic field and thermal convection region.

The magnetic flux directions are aligned on the X- and Z-axes, and the isomagnetic field distribution is illustrated as an eliptical curve distribution on the X-Z plane of FIG. 5. If a direction passing through the intersection (i.e., the origin) of the X- and Z-axes, and perpendicular to the X- and Z-axes is defined as Y-axis, the isomagnetic field distribution is a circular curve distribution on the X-Y plane, these circles being concentric. It should be noted that the isomagnetic field distribution of FIG. 5 can be circular in accordance with different coil arrangements and energization current values. In this case, the coil distance and energization currents to the coils are determined, as shown in FIG. 6, such that the isomagnetic field intensity curve $B_{10}$ near the lower portion of the layer 34 corresponds to the critical Grashof number $N_{GR}$ of equation (1). The intensity $B_{10}$ falls within a range of 1,000 to 2,000 Gauss, and is determined in accordance with the type of melt 32, the charge amount of the melt 32 and the inner diameter of the crucible 42. When such a magnetic distribution is applied to the melt 32, the magnetic field intensity is smaller than that indicated by the curve $B_{10}$ in a region 103 below the curve $B_{10}$. Therefore, the Grashof number $N_G$ of the melt 32 is larger than the critical Grashof number $N_{GR}$, thereby causing thermal convection 102.

However, in a region 104 above a region indicated by the curve $B_{10}$, the magnetic field intensity is larger than that indicated by the curve $B_{10}$, so that the Grashof number $N_G$ of the melt 32 is smaller than the critical Grashof number $N_{GR}$. As a result, thermal convection is prevented, and the melt 32 is kept still. A thickness $H_1$ of the region 104 falls within the following range:

$$\delta < H_1 < H_0$$

where $\delta$ is the thickness of the layer 34, and $H_0$ is the initial height of the melt 32. The height $H_1$ is determined by the type of melt 32, its charge amount and the inner diameter of the crucible. In other words, the shape of the coils 48 and 52, the ampere turn and the coil distance are determined by magnetic field distribution calculation so as to set the parameters $H_1$, D, $H_0$ and $B_{10}$ at predetermined values.

The thermal convection 102 occurs in the interior defined by the curve $B_{10}$. Heat from the heater 44 can be sufficently conducted to the center of the melt, thereby obtaining a substantially uniform temperature distribution in this region. In contrast, in a region outside the curve $B_{10}$, the melt 32 is completely still, so that no thermal transfer occurs. When the thermal convection of the melt 32 is entirely restricted in the conventional single crystal growth apparatus, heat is conducted from the heater 44 to the layer 34 by heat transfer from the periphery of the crucible 42 alone. However, according to this embodiment, the layer 34 is effectively heated by a uniform temperature melt portion lower than the depth $H_1$ ($H_1 << D/2$; see FIG. 6) immediately below the layer 34. Unlike the conventional apparatus, the heat conduction effect for heating the layer 34 can, in the present invention, be improved, and the temperature difference between the center of the crucible and the peripheral portion thereof can be decreased. In addition, the layer 34 is static, so that a thermally and chemically stable single crystal ingot 36 can be prepared, the melt 32 having been stirred sufficiently by thermal convection to a depth below the layer 34 to thereby feed the uniform melt 32 to the single crystal growth portion.

Figure 8A:
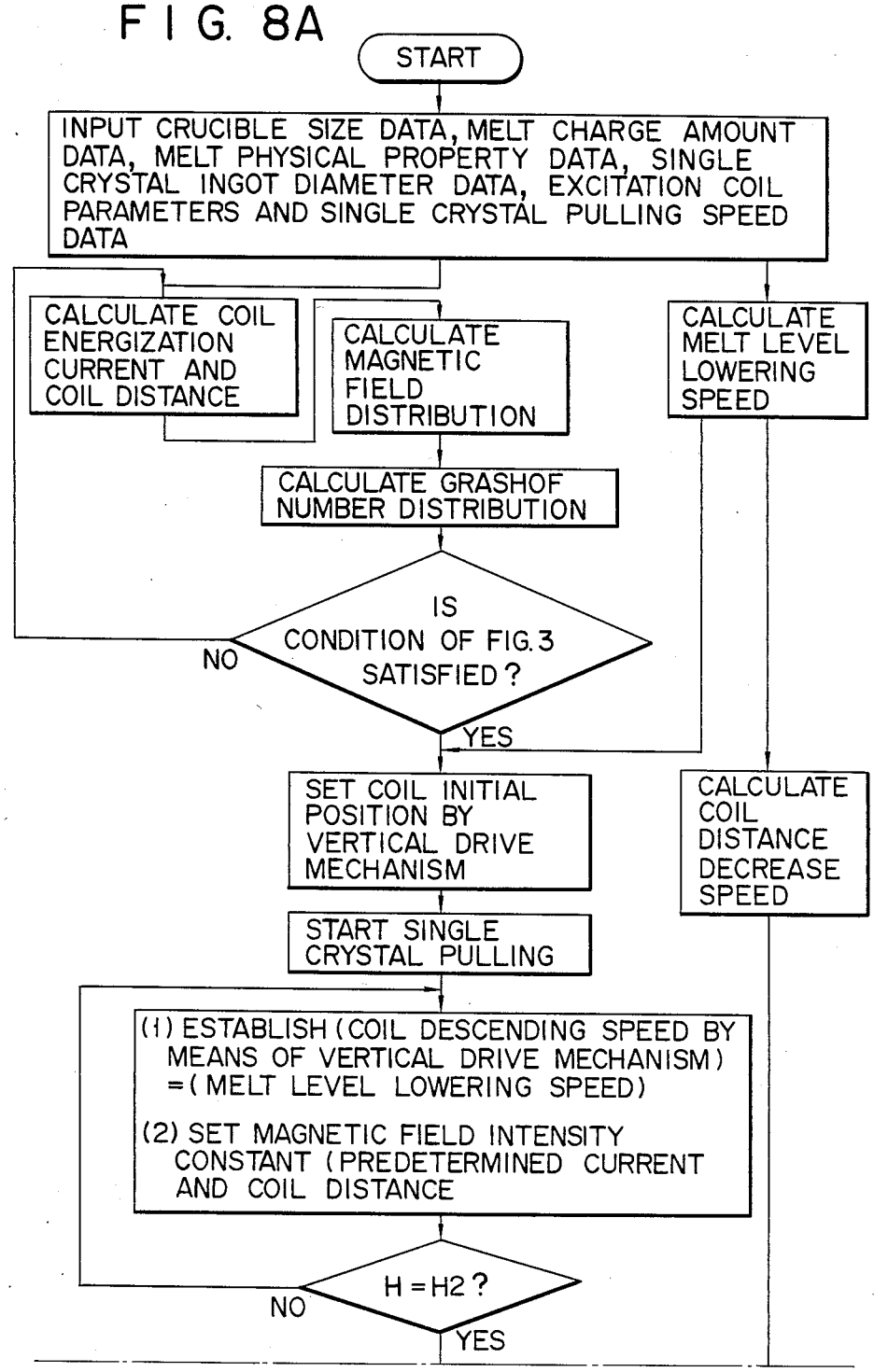
FIGS. 8A and 8B are flow charts for explaining the control mode of a CPU.
Figure 8B:
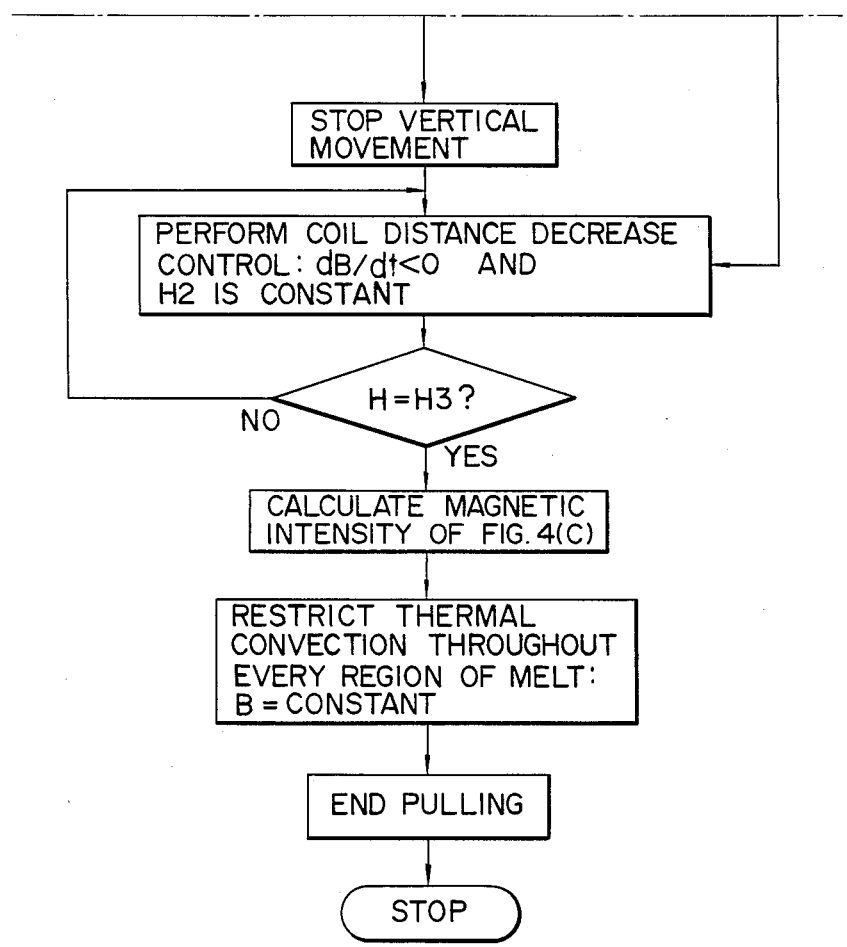

The operation of the single crystal growth apparatus with the above arrangement will be described with reference to the flow chart of the control mode of the CPU 76 in FIG. 8.

(1) Initial Setting

The melt 32 is charged in the crucible 32 to a height $H_0$, and is then heated by the heater 44. Crucible dimension data, melt charge amount data, melt physical property data, single crystal ingot diameter data, excitation coil parameters and single crystal pulling speed data are fetched by the CPU 76 through an input device 77. As shown in FIG. 6, the coil distance, the coil position and the coil currents are determined such that the curve $B_{10}$ corresponding to the critical Grashof number $N_{GR}$ is formed below the layer 34. An initial coil distance $L_0$, a coil position and an initial energization current $I_0$ are set to satisfy the magnetic distribution conditions to obtain the distribution shown in FIG. 6. The coil distance and position are adjusted by the mechanisms 61 and 65, respectively. The CPU 76 also calculates the minimum height $H_2$ (FIG. 7B) of the region 103 at which thermal convection effectively occurs, as well as a height $H_3$ (FIG. 7C) of the melt 32 at which a single crystal is effectively grown under the presence of thermal convection.

(2) Constant Magnetic Field Application and Coil Descending Control

At the beginning of single crystal pulling, the seed crystal 38 is dipped in themelt 32 to grow the single crystal. The grown crystal is pulled by the puller 40 at a constant pulling speed V (cm/sec) to prepare a single crystal ingot 36. The current supplied to the coils 48 and 52, and the distance thereof are predetermined, so that the magnetic field distribution shown in FIG. 6 is formed between the coils 48 and 52.

The pulling speed is calculated by the circuit 92, and the melt surface position is calculated by the circuit 94. These data are fetched by the CPU 76, under whose control the diminishing level of the melt surface is matched with the descending speed of the coil. The CPU 76 supplies a signal to the driver 86, and the driver 86 drives the motor 70 to move the coils 48 and 52 at the predetermined speed. The melts surface level is lowered while the thickness $H_1$ of the region 104 is kept substantially unchanged. The coil position is calculated by the circuit 80, and supplied to the circuit 82. The circuit 82 calculates the height H of the region 100.

(3) Constant Coil Position and Magnetic Field Intensity Decrease Control

As shown in FIG. 7B, when H coincides with $H_2$ (i.e., a height at which thermal convection effectively occurs), the CPU 76 stops the coils 48 and 52, and the driver 84 drives the motor 64 to decrease the coil distance. As a result, the magnetic field intensity applied to the melt is decreased. When the state is changed from the state of FIG. 7B to that of FIG. 7C, single crystal growth progresses, and the region 104 is decreased. In general, the amount of melt present in the region 104 is proportional to the magnetic field intensity. In addition, when an excessively strong magnetic field is applied, the thermal and chemical stability of the melt 32 in the layer 34 is confirmed as having been disturbed. For this reason, the intensity of the magnetic field applied to the melt 32 should be decreased in correspondence with a decrease in the thermal convection restriction region. According to the most effective method, the coil distance L is decreased while the energization current flowing in the coils 48 and 52 is kept unchanged.

When the coil distance L is decreased while the energization current flowing in the coils 48 and 52 is kept unchanged, the magnetic field intensity is decreased accordingly. The above technique is employed for the following reason. For example, when the coils 48 and 52 comprise superconductive coils, respectively, liquid helium is filled in the housings 50 and 54 to keep the coils 48 and 52 at the extremely low temperature of 4.2° K. In order to decrease the amount of liquid helium evaporation, current leads between the coils 48 and 52 and the external power supply 87, consisting of the circuits 88 and 90, are removed after the coils 48 and 52 are energized, thereby eliminating external heat. The superconductive coils are operated in the permanent current mode by a permanent current switch mounted at the coil side. When the magnetic field intensity of the superconductive coils is changed by a change of the exciting current, the leads must be reattached to the coils to cancel the permanent current mode, resulting in cumbersome operation. Furthermore, a large amount of liquid helium is evaporated when the room temperature current leads are inserted in the extremely low-temperature liquid helium.

According to the most effective method, the magnetic field intensity is changed while the excitation current is kept unchanged, i.e., in the permanent current mode. However, when the coils 48 and 52 are copper coils, the excitation current from the supply 87 is decreased to lower the magnetic field intensity. Even if the coils 48 and 52 comprise superconductive coils, respectively, the energization current can be decreased in the same manner as described above if they are not operated in the permanent current mode. The remaining amount of the melt 32 is uniquely determined by the pulling speed. Therefore, the coil distance is adjusted by the mechanism 61 to generate a magnetic field intensity suitable for the remaining amount of the melt 32. This control is performed under the control of the CPU 76.

When the coils 48 and 52 comprise superconductive coils operated in the permanent current mode, the coils 48 and 52, connected through the permanent current switch, must be connected in the liquid helium. As shown in FIG. 3, the housings 50 and 54 for housing the coils 48 and 52 are connected through the flexible connecting member 60. The connecting member 60 is filled with the liquid helium. the current leads extend through the member 60 to connect the coils 48 and 52. When the coil distance is adjusted, the flexible member 60 is elongated or contracted accordingly.

(4) Coil Position and Magnetic Field Constant Control

As shown in FIG. 7C, when the remaining amount of the melt 32 is $H_3 - \delta$, the growth is completed in accordance with either of the following two methods.

[1] Since the height $H_3$ is sufficiently low and the remaining amount of melt small enough to disable further growth of the single crystal, a tail of the single crystal ingot is formed by the remaining melt, while the single crystal ingot 36 is cooled.

[2] When single crystal growth can be continued by the remaining melt, a current supplied to the coils 48 and 52 is increased slightly to slightly increase the magnetic field applied to the melt. The single crystal can be grown by the remaining melt while the thermal convection is restricted throughout the entire region. In this case, the remaining amount of melt is sufficiently small, and the temperature gradient is slight enough to manufacture a single crystal ingot of high quality while thermal convection is completely restricted.

A third embodiment of the present invention will be described. The ampere turns of the coils are modified to move a boundary between a thermal convection restriction region and a thermal convection region downward.

Referring to FIG. 3, the ampere turns of the coils 48 and 52, whose axes are vertical, are changed.

In order to obtain different ampere turns of the coils 48 and 52, the number of turns of the coil 48 is set differently from that of the coil 52, without changing currents flowing in the coils 48 and 52. Alternatively, separate external power sources 87 can be connected to the coils 48 and 52 to change currents flowing in the coils 48 and 52. In the latter method, variable control of the ampere turn can be performed by controlling the energization currents flowing in the coils 48 and 52.

When the ampere turns of the coils 48 and 52 are different from each other, the coils 48 and 52 provide a magnetic field distribution whose X-axis is shifted either upward or downward, as in FIG. 5. When the ampere turn of the coil 48 is larger than that of the coil 52, the X-axis is shifted downward, i.e., toward the coil 52, as is the elliptical isomagnetic field distribution, its shift being proportional to the difference between the ampere turns of the coils 48 and 52. When the difference is increased, the X-axis is shifted toward the coil 52. However, when the ampere turn of the coil 48 is smaller than that of the coil 52, the opposite effect is obtained.

When the ampere turns are different from each other in the manner described above, other properties excluding shifting of the X-axis are the same as those of FIG. 5. The behavior of the coils 48 and 52 is the same as that described with reference to FIGS. 6 and 7. In this case, when the ampere turns of the coils 48 and 52 are varied, the magnetic field intensity at the position of the crucible 42 can also be varied. The mechanisms 65 and 61, shown in FIG. 3, can be replaced with the ampere turn variable control. When the state is changed from the state of FIGS. 7A to 7B, the magnets are moved downward in the embodiment of FIG. 3. However, in this embodiment, the ampere turns of the coils 48 and 52 are varied while the magnet positions remain unchanged. The operation for changing the state of FIG. 7B to that of FIG. 7C can also be performed in the same manner as described above. In this embodiment, the same effect as in FIG. 3 can be obtained without the mechanisms 61 and 65.

In the first embodiment (FIGS. 3 and 4), the magnetic field intensity is adjusted by a downward shifting of the coils and a decrease in coil distance. However, according to the third embodiment (FIG. 9), the magnetic field intensity can be adjusted by changing the number of turns (ampere turns) of the coils.

The magnetic field intensity, however, can also be changed by causing the mechanism 65 to shift the coil position downward or by adjusting the coil distance through the mechanism 61, thereby achieving the object of the present invention. Furthermore, by adjusting the energization currents supplied to the coils 48 and 52 by the circuits 88 and 90, the boundary between the regions 103 and 104 can be moved downward in the same manner as in the case wherein the ampere turns of the coils are different from each other, thereby also achieving the prescribed object of the present invention.

What is claimed is:

1. A single crystal growing method comprising the steps of:
   dipping a seed crystal in a single crystal material melt stored in a vessel and heated by heating means;
   pulling a single crystal growing in a solid-liquid interface layer in the melt;

forming a first magnetic field having an intensity for preventing thermal convection in an upper melt portion, and a second magnetic field having an intensity which does not prevent thermal convection in a lower melt portion, by a pair of coils whose axes are aligned with each other, said axes extending vertically, each of said coils lying in a respective substantially horizontal plane, one above the other each of the magnetic fields having isomagnetic field distribution curves of a circular or elliptical shape in a plane including the axes of said coils; and moving a boundary between the first and second magnetic field regions downward upon the downward shift of a surface of the melt.

2. A single crystal growth apparatus comprising:

a vessel for holding a single crystal material melt;

heating means for heating the melt in said vessel;

a single crystal puller for dipping a seed crystal in the melt and for pulling a single crystal growing in a solid-liquid interface layer in the melt;

magnetic field forming means including a pair of coils whose axes are aligned with each other, said axes extending vertically, each of said coils lying in a respective substantially horizontal plane, one above the other and energizing means for energizing said pair of coils so as to generate opposing magnetic fluxes along an axial direction of said coils, thereby applying a first magnetic field having an intensity for preventing thermal convection in an upper melt portion and a second magnetic field having an intensity which does not prevent thermal convection in a lower melt portion, each of the magnetic fields having isomagnetic field distribution curves of a circular or elliptical shape in a plane including the axes of said coils; and magnetic field adjusting means for moving a boundary between the first and second magnetic regions downward upon the downward shift of a surface of the melt.

3. An apparatus according to claim 2, wherein said magnetic field adjusting means comprises a coil descending drive mechanism for moving said coils downward, thereby also moving the boundary between the first and second magnetic field regions downward to the minimum height $H_2$ at which thermal convection can effectively occur in the melt, this being a melt surface position.

4. An apparatus according to claim 3, wherein said magnetic field adjusting means comprises a coil distance adjusting mechanism for changing the coil distance, the coil distance being decreased by said coil distance adjusting mechanism to decrease the intensity of the magnetic field applied to the melt until the melt level is decreased to an appropriate height $H_3$ after the boundary between the first and second magnetic field regins is decreased to the height $H_2$, the height $H_3$ being defined as the minimum height at which the first magnetic field region is present to effectively grow the single crystal.

5. An apparatus according to claim 4, wherein said magnetic field adjusting means keeps the coil position and the coil distance constant so as to apply a given magnetic field intensity to the melt after the melt level is decreased to the height $H_3$.

6. An apparatus according to claim 3, wherein said magnetic field adjusting means keeps the coil position and the coil distance constant so as to apply to the melt a given magnetic field where only the first magnetic field region appears in the melt after the boundary between the first and second magnetic field regions is decreased to the height $H_2$.

7. An apparatus according to claim 2, wherein said magnetic field adjusting means comprises the coil distance adjusting mechanism for changing the coil distance, and for decreasing the coil distance to shift the boundary between the first and second magnetic field regions to the height $H_2$ upon downward movement of the melt surface position, the height $H_2$ being defined as the minimum height at which thermal convection can effectively occur.

8. An apparatus according to claim 7, wherein said magnetic field adjusting means keeps the coil position and the coil distance constant so as to apply to the melt a given magnetic field where only the first magnetic field region appears in the melt after the boundary between the first and second magnetic field regions is decreased to the height $H_2$.

9. An apparatus according to claim 2, wherein said magnetic field adjusting means comprises excitation current changing means for changing excitation currents flowing through said coils, said magnetic field adjusting means being arranged such that the excitation currents of said coils are alternately changed to lower the boundary between the first and second magnetic field regions to the height $H_2$ upon downward movement of the melt, the height $H_2$ being defined as the minimum height at which thermal convection can effectively occur in the melt.

10. An apparatus according to claim 9, wherein said magnetic field adjusting means keeps the coil position and the coil distance constant so as to apply to the melt a given magnetic field where only the first magnetic field region appears in the melt after the boundary between the first and second magnetic field regions is decreased to the height $H_2$.

11. An apparatus according to claim 10, wherein said coils of said magnetic field forming means are arranged such that the axes thereof extend vertically, said magnetic field adjusting means being arranged to increase the energization current of the upper coil and to decrease the energization current flowing in the lower coil upon downward movement of the melt surface position, thereby moving the boundary between the first and second magnetic field regions downward.

12. An apparatus according to claim 2, wherein said magnetic field adjusting means comprises winding number changing means for changing the number of turns of said coils, the number of turns of one of said coils being set to differ from that of the other coil, thereby moving the boundary between the first and second magnetic field regions to the height $H_2$ upon downward movement of a melt surface position, the height $H_2$ being defined as the minimum height at which thermal convection can effectively occur in the melt.

13. An apparatus according to claim 2, wherein said coils comprise superconductive coils, and said magnetic field forming means comprises housings both for housing said coils and for sealing a refrigerant therein.

14. An apparatus according to claim 2, wherein said pair of coils are moved downwardly in synchronism with each other.

15. A single crystal produced by the method comprising the steps of:

dipping a seed crystal in a single crystal material melt stored in a vessel and heated by heating means;

pulling a single crystal growing in a solid-liquid interface layer in the melt;
forming a first magnetic field region having an intensity for preventing thermal convection in an upper melt portion and a second magnetic field region having an intensity which does not prevent thermal convection in a lower melt portion; and
moving a boundary between the first and second magnetic field regions downward upon the downward shift of a surface of the melt.

* * * * *